United States Patent
Fraley et al.

(10) Patent No.: US 7,023,707 B2
(45) Date of Patent: *Apr. 4, 2006

(54) INFORMATION HANDLING SYSTEM

(75) Inventors: Lawrence R. Fraley, Endicott, NY (US); Voya R. Markovich, Endwell, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 373 days.

This patent is subject to a terminal disclaimer.

(21) Appl. No.: 10/394,135

(22) Filed: Mar. 24, 2003

(65) Prior Publication Data

US 2004/0150101 A1    Aug. 5, 2004

Related U.S. Application Data

(63) Continuation-in-part of application No. 10/354,000, filed on Jan. 30, 2003, now Pat. No. 6,828,514.

(51) Int. Cl.
*H05K 7/06*   (2006.01)
*H05K 7/20*   (2006.01)
*H01L 23/34*  (2006.01)
*H01L 23/58*  (2006.01)

(52) U.S. Cl. .............. 361/783; 361/719; 361/780; 361/794; 257/704; 257/706; 257/707; 257/723

(58) Field of Classification Search ........ 257/686, 257/704, 706, 707, 713, 723, 777; 361/719, 361/720, 780, 794; 174/252
See application file for complete search history.

(56) References Cited

U.S. PATENT DOCUMENTS

| | | | |
|---|---|---|---|
| 4,882,454 A | 11/1989 | Peterson et al. | |
| 4,902,610 A | 2/1990 | Shipley | |
| 5,072,075 A | 12/1991 | Lee et al. | |
| 5,121,190 A | 6/1992 | Hsiao et al. | |
| 5,336,855 A | 8/1994 | Kahlert et al. | |
| 5,418,690 A | 5/1995 | Conn et al. | |
| 5,483,421 A | 1/1996 | Gedney et al. | |
| 5,574,630 A | 11/1996 | Kresge et al. | |
| 5,615,087 A | 3/1997 | Wieloch | |
| 5,661,089 A | 8/1997 | Wilson | |
| 5,668,409 A * | 9/1997 | Gaul | 257/723 |
| 5,768,109 A | 6/1998 | Gulick et al. | |
| 5,798,563 A | 8/1998 | Feilchenfeld et al. | |

(Continued)

FOREIGN PATENT DOCUMENTS

JP    1-307294    12/1989

(Continued)

OTHER PUBLICATIONS

IBM TDB, "Multi Chip Cooling Plate", Jul. 1978 pp. 745-746.

(Continued)

*Primary Examiner*—John B. Vigushin
(74) *Attorney, Agent, or Firm*—Hinman, Howard & Kattell, LLP; Lawrence R. Fraley

(57) ABSTRACT

An information handling system, e.g., computer, server or mainframe, which includes a multi-chip electronic package utilizing an organic, laminate chip carrier and a plurality of semiconductor chips positioned on an upper surface of the carrier. The organic, laminate chip carrier is comprised of a plurality of conductive planes and dielectric layers and couples the chips to underlying conductors on the bottom surface thereof. The carrier may include a high-speed portion to assure high-frequency connection between the semiconductor chips and may also include an internal capacitor and/or thermally conductive member for enhanced operational capabilities of the final system product.

40 Claims, 11 Drawing Sheets

U.S. PATENT DOCUMENTS

| | | | |
|---|---|---|---|
| 5,815,374 A * | 9/1998 | Howell | 361/768 |
| 5,838,063 A | 11/1998 | Sylvester | |
| 5,891,869 A | 4/1999 | Lociuro et al. | |
| 5,894,173 A | 4/1999 | Jacobs et al. | |
| 5,894,517 A | 4/1999 | Hutchison et al. | |
| 5,900,675 A | 5/1999 | Appelt et al. | |
| 5,912,809 A * | 6/1999 | Steigerwald et al. | 361/780 |
| 5,926,377 A | 7/1999 | Nakao et al. | |
| 5,956,236 A * | 9/1999 | Corisis et al. | 361/783 |
| 5,982,630 A | 11/1999 | Bhatia | |
| 6,023,211 A | 2/2000 | Somei | |
| 6,075,423 A | 6/2000 | Saunders | |
| 6,081,430 A | 6/2000 | La Rue | |
| 6,104,093 A * | 8/2000 | Caletka et al. | 257/778 |
| 6,146,202 A | 11/2000 | Ramey et al. | |
| 6,181,004 B1 * | 1/2001 | Koontz et al. | 257/691 |
| 6,212,074 B1 * | 4/2001 | Gonsalves et al. | 361/717 |
| 6,222,740 B1 | 4/2001 | Bovensiepen et al. | |
| 6,246,010 B1 | 6/2001 | Zenner et al. | |
| 6,313,521 B1 * | 11/2001 | Baba | 257/676 |
| 6,351,393 B1 | 2/2002 | Kresge et al. | |
| 6,370,012 B1 | 4/2002 | Adae-Amoakoh et al. | |
| 6,431,914 B1 | 8/2002 | Billman | |
| 6,437,240 B1 * | 8/2002 | Smith | 174/52.2 |
| 6,469,381 B1 * | 10/2002 | Houle et al. | 257/707 |
| 6,495,772 B1 | 12/2002 | Anstrom et al. | |
| 6,696,765 B1 * | 2/2004 | Kazama et al. | 257/779 |
| 6,847,527 B1 * | 1/2005 | Sylvester et al. | 361/763 |
| 6,941,649 B1 * | 9/2005 | Goergen | 29/846 |
| 2002/0125967 A1 | 9/2002 | Garrett et al. | |
| 2003/0002260 A1 * | 1/2003 | Hasebe et al. | 361/720 |

FOREIGN PATENT DOCUMENTS

| | | | |
|---|---|---|---|
| JP | 4025155 A2 | 1/1992 | |
| JP | 05235255 A * | 9/1993 | |
| JP | 6112271 A2 | 4/1994 | |
| JP | 9-232376 | 9/1997 | |
| JP | 10-209347 | 8/1998 | |
| JP | 11-087560 | 3/1999 | |
| JP | 2000-022071 | 1/2000 | |
| JP | 2000-024150 | 1/2000 | |

OTHER PUBLICATIONS

IBM TDB, "Simultaneous Chip Placement—Multi-Chip Modules", Feb. 1982 pp. 4647-4649.

IBM TDB, "High Performance Multi-Chip Module", Nov. 1987 pp 437-439.

IBM TDB, "Low-Cost, High-Power, Multi-Chip Module Design", Aug. 1988 pp. 451-452.

IBM TDB, "Thermally Conductive Substrate Mounted Multi-Chip Module Cap", Sep. 1993 pp. 623-624.

* cited by examiner

INFORMATION HANDLING SYSTEM

CROSS-REFERENCE TO APPLICATION

This application is a continuation-in-part of application Ser. No. 10/354,000, filed Jan. 30, 2003, and entitled, "High Speed Circuit Board And Method For Fabrication" (inventors: B. Chan et al). Ser. No. 10/354,000 is now U.S. Pat. No. 6,828,514, which issued Dec. 07, 2004.

TECHNICAL FIELD

The present invention relates, in general, to information handling systems, and in particular, to those which are capable of utilizing electronic packages.

BACKGROUND OF THE INVENTION

Various electronic packages for use in information handling systems are known. Often, these utilize organic substrates and include a chip bonded thereto. Organic laminate substrates, for example printed circuit boards and chip carriers, have been and continue to be developed for many applications. These are expected to displace ceramic substrates in many chip carrier applications, because of reduced cost and enhanced electrical performance. The use of a multi-layered interconnect structure such as an organic, laminate chip carrier for interconnecting a semiconductor chip to a printed circuit board in an information handling system (IHS) introduces many challenges, one of which is the reliability of the connection joints between the semiconductor chip and the organic chip carrier and another of which is the reliability of the connection joints between the organic chip carrier and the printed circuit board. Clearly, failure of these could prove very costly to the IHS owner.

With semiconductor chip input/output (I/O) count increases beyond the capability of peripheral lead devices and as the need for both semiconductor chip and printed circuit board miniaturization increases, area array interconnects are the preferred method for making large numbers of connections between a semiconductor chip and an organic chip carrier and between the organic chip carrier and a printed circuit board in IHS applications. If the coefficient of thermal expansion (CTE) of the semiconductor chip, the organic chip carrier, and the printed circuit board are substantially different from one another, industry standard semiconductor chip array interconnections to the organic chip carrier can exhibit high stress during operation (thermal cycling). Similarly, the industry standard ball grid array (BGA) interconnections between the organic chip carrier and printed circuit board can also exhibit high stress during operation. Significant reliability concerns may then become manifest by failure of the connections or even failure of the integrity of the semiconductor chip (chip cracking). These reliability concerns significantly inhibit design flexibility. For example, semiconductor chip sizes may be limited or interconnect sizes, shapes and spacing may have to be customized beyond industry standards to reduce these stresses. These limitations may limit the electrical performance advantages of the organic electronic package or add significant cost to the electronic package and IHS utilizing same. Typically a semiconductor chip has a CTE of 2–3 parts per million per degree Celsius (ppm/° C.) while a standard printed circuit board has a much greater CTE of 17–20 ppm/° C.

An example of an organic chip carrier designed to overcome such CTE and related problems is defined in U.S. Pat. No. 6,351,393 (J. S. Kresge et al) which includes a specific thermal internally conductive layer designed to prevent failure between the single chip and the carrier solder connections, and those between the carrier and base substrate (e.g., PCB) on which it is positioned. This patent is incorporated herein by reference.

Examples of other various electronic packages such as the above are shown and described in the following documents:

| U.S. Patents | | |
|---|---|---|
| 4,882,454 | 11/1989 | Peterson et al |
| 5,072,075 | 12/1991 | Lee et al |
| 5,121,190 | 6/1992 | Hsiao et al |
| 5,483,421 | 1/1996 | Gedney et al |
| 5,615,087 | 3/1997 | Wieloch |
| 5,661,089 | 8/1997 | Wilson |
| 5,798,563 | 8/1998 | Fielchenfeld et al |
| 5,838,063 | 11/1998 | Sylvester |
| 5,894,173 | 4/1999 | Jacobs et al |
| 5,900,675 | 5/1999 | Appelt et al |
| 5,926,377 | 7/1999 | Nakao et al |
| 5,982,630 | 11/1999 | Bhatia |

| Foreign Patent Documents | | |
|---|---|---|
| JP | 1-307294 | 12/1989 |
| JP | 6-112271 | 4/1994 |
| JP | 9-232376 | 9/1997 |
| JP | 10-209347 | 8/1998 |
| JP | 11-087560 | 3/1999 |
| JP | 2000-022071 | 1/2000 |
| JP | 2000-024150 | 1/2000 |

To increase the operational characteristics of such modules, the addition of more than one chip to the upper surface of a chip substrate has been considered. However, due to the operating temperatures of such added chips, especially if placed in a closely spaced orientation, a much higher temperature compensating substrate material, ceramic, has usually been required, especially when the substrate having the chips is to be mounted on and coupled to an organic substrate such as a typical IHS PCB. Examples are described in the following IBM Technical Disclosure Bulletins (TDBs):

| 07/1978 | Multi Chip Cooling Plate | pp 745–746 |
| 02/1982 | Simultaneous Chip Placement —Multi-Chip Modules | pp 4647–4649 |
| 11/1987 | High Performance Multi-Chip Module | pp 437–439 |
| 08/1988 | Low-Cost, High-Power, Multi-Chip Module Design | pp 451–452 |
| 09/1993 | Thermally Conductive Substrate Mounted Multi-Chip Module Cap | pp 623–624 |

Ceramic use, however, poses many problems, a primary one of which is handling. Ceramic is a relatively brittle material capable of cracking and chipping if handled improperly during manufacture and shipping. Ceramic is also a relatively difficult material to process, especially to the multi-depth level where several individual layers of insulative and interconnecting conductive materials are needed to satisfy many operational requirements.

Non-ceramic chip carriers have been proposed, but these typically possess various drawbacks. In U.S. Pat. No. 5,574,630, for example, three chips are mounted on a substrate comprised of silica-filled polytetrafluoroethylene (PTFE) but require individual through holes to pass entirely through the carrier's thickness to connect to desired connections on the opposite side. Additionally, this structure in turn mandates utilization of a complex "power/ground assembly" of several layers having specific CTEs and other properties, thus resulting in a very expensive final assembly and one that is relatively difficult to construct, adding further cost to the IHS.

Another non-ceramic substrate embodiment for having more than one chip thereon is described in U.S. Pat. No. 6,246,010. Unfortunately, the substrates require semiconductor chips which are extremely thin (less than 100 μm, preferably less than 50 μm, and "most preferably" less than 20 μm). Understandably, such thinned chips are incapable of adequately providing the much greater operational capabilities as required by today's more powerful IHS chips (e.g., those of the application specific integrated circuit (ASIC) variety). Typically, such chips operate at much higher temperatures than other types (e.g., those of the dynamic random access memory (DRAM) variety).

There is defined in Ser. No. 10/354,000, cited above, a PCB which is capable of providing high speed interconnections between two or more components such as chips or modules (chip carriers) mounted thereon. This PCB is specifically designed to accommodate the increased operational requirements for electronic structures such as electronic modules which mount on the PCBs and are coupled together through the board's circuitry. One particular increase that this PCB accommodates is the need for higher frequency connections between the mounted components, which connections, as stated, occur through the underlying host PCB. Such connections are subjected to the detrimental effects, e.g., signal deterioration, caused by the inherent characteristics of such known PCB wiring. For example, signal deterioration is expressed in terms of either the "rise time" or the "fall time" of the signal's response to a step change. The deterioration of the signal can be quantified with the formula $(Z_o*C)/2$, where $Z_o$ is the transmission line characteristic impedance, and C is the amount of the via capacitance. In a wire having a typical 50 ohm transmission line impedance, a plated through hole via having a capacitance of 4 pico farad (pf) would represent a 100 picosecond (ps) rise-time (or fall time) degradation, as compared to a 12.5 ps degradation with a 0.5 pf buried via of the present invention, as discussed below. This difference is significant in systems operation at 800 MHz or faster, where there are associated signal transition rates of 200 ps or faster.

A usual high performance PCB, prior to the one defined in Ser. No. 10/354,000, has not been able to provide wiring densities beyond a certain point due to limitations imposed by the direct current (DC) resistance maximum in connections between components (especially chips). Similarly, high speed signals demand wider lines than normal PCB lines to minimize the "skin effect" losses in long lines. To produce a PCB with all wide lines would be impractical, primarily because of the resulting excessive thickness needed for the final board. Such increased thicknesses are obviously unacceptable from a design standpoint.

PCB structures of different types are described in the following documents:

| U.S. Patents | | |
| --- | --- | --- |
| 4,902,610 | 02/1990 | C. Shipley |
| 5,336,855 | 09/1994 | J. Kahlert et al |
| 5,418,690 | 05/1995 | R. Conn et al |
| 5,768,109 | 06/1998 | J. Gulick et al |
| 5,891,869 | 04/1999 | S. Lociuro et al |
| 5,894,517 | 04/1999 | J. Hutchison et al |
| 6,023,211 | 02/2000 | J. Somei |
| 6,075,423 | 06/2000 | G. Saunders |
| 6,081,430 | 06/2000 | G. La Rue |
| 6,146,202 | 11/2000 | S. Ramey et al |
| 6,222,740 | 04/2001 | K. Bovensiepen et al |
| 6,431,914 | 08/2002 | T. Billman |
| 6,495,772 | 12/2002 | D. Anstrom et al |
| US2002/0125967 | 09/2002 | R. Garrett et al |

| Foreign Patent Document | | |
| --- | --- | --- |
| JP4025155A2 | 01/1992 | O. Takashi |

The teachings of these documents are incorporated herein by reference.

Unique characteristics of the PCB defined in Ser. No. 10/354,000 allow it to assure high frequency connections while still utilizing relatively standard PCB manufacturing processes to produce the final structure. In this pending application, incorporated herein by reference, a portion of the PCB is dedicated to utilizing relatively wider lines than the remaining, lower portion of the PCB, which includes lines and spacings known in the PCB field.

An IHS structure including a package and substrate of a material other than ceramic or not possessing the severe drawbacks of previous non-ceramic materials as mentioned above and which is capable of providing high speed signal couplings between two or more chips (especially high temperature chips such as ASIC chips) therein, is believed to constitute a significant advancement in the IHS art.

OBJECTS AND SUMMARY OF THE INVENTION

It is, therefore, a primary object of the present invention to enhance the IHS art.

It is another object of the invention to provide an IHS structure which utilizes a multi-chip electronic package which assures high speed connections between the chips thereon, while attaining effective electrical coupling with the underlying circuitized substrate (e.g., PCB) on which one or more of the chip carriers used therein.

It is a further object of the invention to provide such an IHS structure which is capable of providing such connections for high temperature chips such as those of the ASIC variety.

It is still another object of the invention to provide such a structure which can be produced in a cost effective manner while assuring a final structure of robust construction.

According to one aspect of the present invention, there is provided an information handling system comprising an organic, laminate chip carrier including a plurality of electrically conductive planes spacedly positioned therein and separated by respective layers of dielectric material, the chip carrier including a plurality of electrical contacts on a first surface thereof and a plurality of electrical conductors on a second surface thereof, selected ones of the electrical contacts being electrically coupled to selected ones of the electrical conductors, and a plurality of semiconductor chips spacedly positioned on the first surface of the organic, laminate chip carrier and electrically coupled to selected ones of the electrical contacts so as to be coupled to the selected ones of the electrical conductors.

BEST MODE FOR CARRYING OUT THE INVENTION

For a better understanding of the present invention, together with other and further objects, advantages and capabilities thereof, reference is made to the following disclosure and appended claims in connection with the above-described drawings. It is understood that like numerals will be used to indicate like elements from FIG. to FIG.

By the term "high speed" as used herein is meant signals of high frequency. Examples of such signal frequencies attainable for the IHS multilayered chip carriers and circuitized substrates (e.g., PCBs) defined herein and as produced using the methods taught herein include those within the range of from about 3.0 to about 10.0 gigabits per second (GPS). These examples are not meant to limit the IHS of this invention, however, because frequencies outside this range, including those higher, are attainable. As further understood from the following, the IHS carrier products produced herein may be formed of at least two separate multilayered portions (subassemblies) which have themselves been formed prior to bonding to each other. At a minimum, each of these separate portions will include at least one dielectric layer and one conductive layer, with most likely embodiments including several layers of each as part thereof. Examples are provided below and are just that (only examples) and the numbers of layers shown and described are not meant to limit the scope of this invention.

Figure 5:
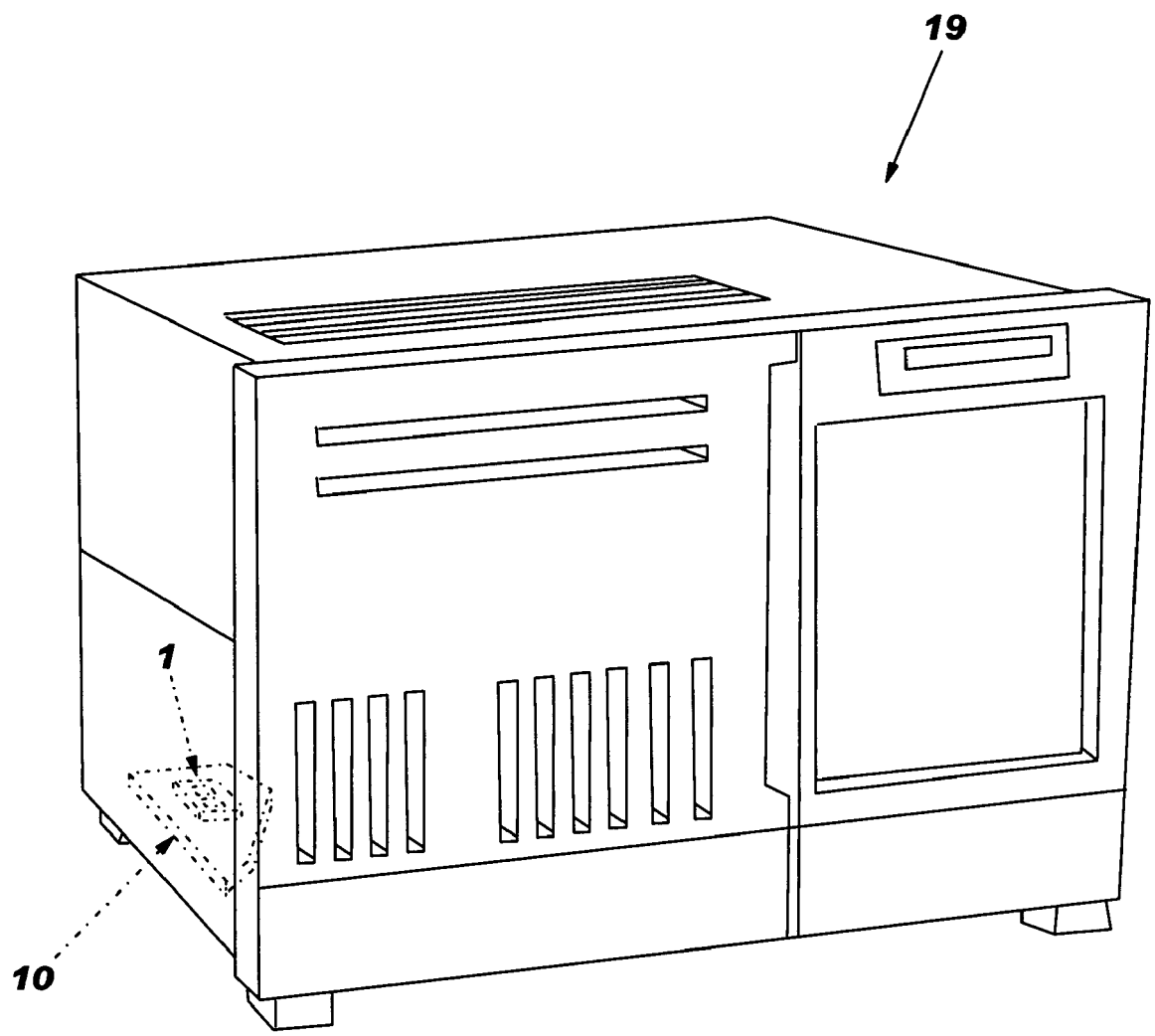
FIG. 5 is a perspective view of an information handling system adapted for using one or more of the multi-chip electronic packages and/or the complete assemblies (including an underlying PCB) defined therein.

By the term "information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as servers, mainframes, etc. An example is shown in FIG. 5, as a server, and is seen to include at least one multi-chip package and a circuitized substrate having the package mounted thereon within the server's housing.

Figure 1:
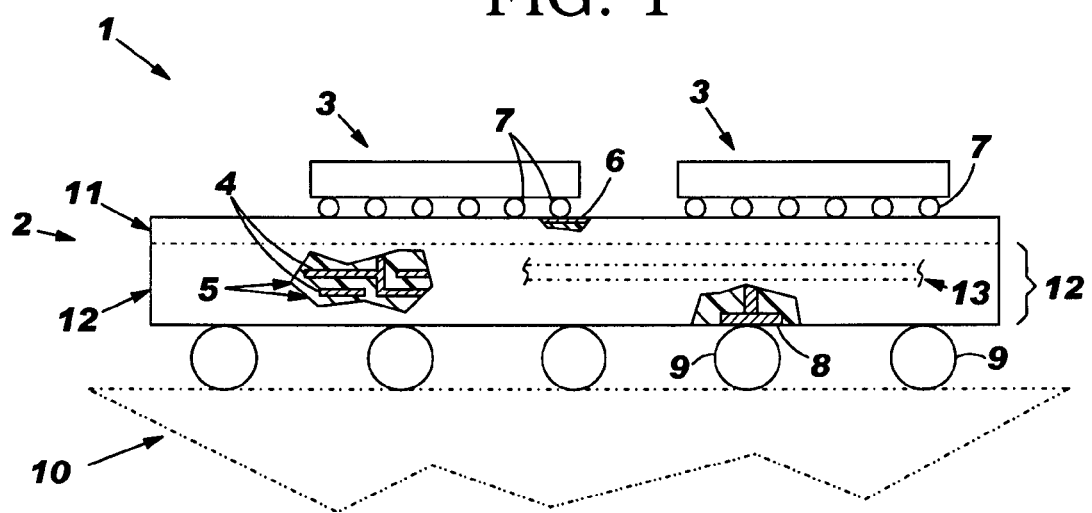
FIG. 1 is a side-elevational view, partly in section, illustrating a multi-chip electronic package usable in an IHS according to one aspect of the invention.

FIG. 1 illustrates a multi-chip electronic package 1 which can be used in one embodiment of an IHS as defined herein. The package includes an organic, laminate chip carrier 2 and a plurality of semiconductor chips 3 located on the carrier. Organic, laminate chip carrier 2 includes a plurality of conductive planes 4 spacedly positioned within the carrier and separated by respective layers of dielectric material 5. Carrier 2 further includes a plurality of electrical contacts 6 (one shown) on the carrier's upper surface, each contact in turn designed for being electrically coupled to a respective conductive member (e.g., a solder ball 7) which in turn couples the contact to a corresponding contact site (not shown) on the undersurface of chip 3. Such chip sites are well known and further description is not believed necessary. Each of the chips 3 is coupled through the internal circuitry of carrier 2 to respective ones of electrical conductors 8 (only one shown) which in turn are capable of being electrically coupled (i.e., utilizing a plurality of solder balls 9 to respective contact sites (not shown) on an underlying circuitized substrate 10, a primary example being a multilayered PCB. This entire structure, as shown in FIG. 5, can be used in an IHS of the invention. Chips 3, using the circuitry on the upper surface of carrier 2 and possibly portions thereof within the carrier, may be electrically coupled to one another depending on the operational requirements for the final IHS product. As further seen in FIG. 1, the individual contacts 6 do not necessarily directly couple to a respective conductor by a linear (here, vertical) connection such as a plated through hole extending from the top of the carrier through the entire thickness thereof.

FIG. 1 also shows both chips occupying a substantially coplanar orientation on the upper surface of carrier 2 and are spaced apart from one another. In one example, each chip may possess length and width dimensions of about 10 mils and 20 mils, respectively, and may be coupled to the carrier using a plurality of solder balls 7 having a number within the range of from about 1,000 to about 3,000. Each chip may be an ASIC chip or other type, depending on product operational requirements.

Carrier 2, in one version, includes an upper, high-speed portion 11 and a lower portion 12 in which signals pass at lower frequencies. A more specific example of this particular construction will be defined hereinbelow. The dielectric material for carrier 2 may be selected from a variety of known PCB dielectric materials, including known fiberglass-reinforced epoxy resin, Driclad (a registered trademark of the assignee of this invention), PTFE, Nelco 6000SI, Rogers 4300, Polyclad LD621 (see below), etc. It does not necessarily need to be comprised of PTFE, however. It is also possible that carrier 2 may include a thermally conductive member 13 therein. If so utilized, the thermally conductive member 13 may be comprised of a material having a selected thickness and coefficient of thermal expansion to substantially prevent failure of the solder connections provided by solder balls 7 and 9. Thermally conductive member 13 can be a suitable metal comprised of nickel, copper, molybdenum, or iron. Preferably, the thermally conductive layer also functions as a ground plane. The preferred thermally conductive member (which has a CTE of close to zero) is a three layered structure comprised of a first layer of copper, a second layer of an alloy of about 34% to about 38% nickel (preferably about 36% nickel) and about 62% to about 66% iron (preferably about 63% iron), and a third layer of copper. The overall CTE of thermally conductive member 13 is from about 4 to about 8 ppm/° C. Preferably, about 72% to about 80% of the thickness of the thermally conductive layer is the nickel-iron alloy and about 20% to about 28% of the thickness of the thermally conductive layer is copper. A suitable 36% nickel-63% iron alloy is available from Texas Instruments Incorporated (Attleboro, Mass.). Alternatively, the thermally conductive member can be formed solely of a single metal alloy such as about 36% nickel-about 63% iron alloy. The thickness of the thermally conductive member is preferably from only about 1 mil to about 3 mils. The thickness and choice of material for the member will determine the CTE of the member and, significantly, can be used to control the CTE of the multi-layered chip carrier when used in combination with the other elements defined herein. When the overall CTE of the multi-layered interconnect structure is controlled to a value of about 10 to about 12 ppm/° C., a significant advantage is achieved. Strain control on the solder connections is realized and localized regions of high strain are avoided during operation of the package (when assembled to a circuitized substrate and in field operation), an important feature if two or more chips are used and in close proximity to one another. The overall strain between the semiconductor chips 12, with a CTE of about 2–3 ppm/° C., and the circuitized substrate, with a CTE of about 17–20 ppm/° C., is thus significantly reduced in magnitude. Further description of this member is provided in U.S. Pat. No. 6,351,393, incorporated herein by reference.

The chip carrier shown in FIGS. 1–4 may also include an internal capacitor structure therein, such as described in U.S. Pat. No. 6,370,012, also incorporated herein by reference. As defined therein, the capacitor structure is a parallel capacitor suitable for use in chip carriers or the like designed for being positioned on an underlying substrate such as a PCB. In the structure of U.S. Pat. No. 6,370,012, the capacitor preferably includes at least one internal conductive layer, two additional conductor layers added on opposite sides of the internal conductor and inorganic dielectric material (preferably an oxide layer) on the second conductor layer's outer surfaces. Alternatively, a suitable dielectric material such as berium titanate applied to the second conductive layer may be utilized. Further, the capacitor in this cited patent includes outer conductor layers atop the inorganic dielectric material to thus form a parallel capacitor between the internal and added conductive layers and the outer conductors. Further description is found in U.S. Pat. No. 6,370,012.

Figure 2:
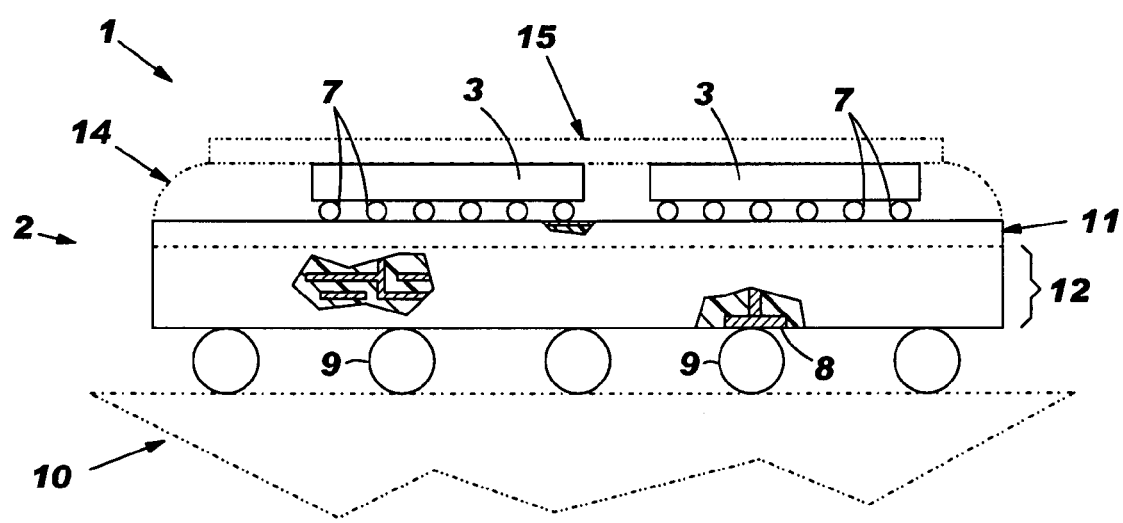
FIG. 2 is a side-elevational view of the package of FIG. 1 further including a quantity of encapsulant and a cover member thereon.

The package 1 of FIG. 1 is shown in FIG. 2 to further include a quantity of encapsulant material 14 (in phantom) which lies on the upper surface of carrier 2 and substantially surrounds the semiconductor chips 3, including the underlying solder ball connections 7. Encapsulant materials are known in the packaging art and further description is not believed necessary. Suitable examples can be found in one more of the documents cited hereinabove. Package 1 in FIG. 2 is also shown to include a heat sinking cover member 15 (also in phantom) which lies atop the formed encapsulant and in thermal contact with the upper surfaces of the semiconductor chips 3. Member 15 thus serves to facilitate heat removal from the chips during operation thereof. In one example, cover member 15 is preferably of copper, but may also be aluminum or other sound, thermally conductive material.

Figure 3:
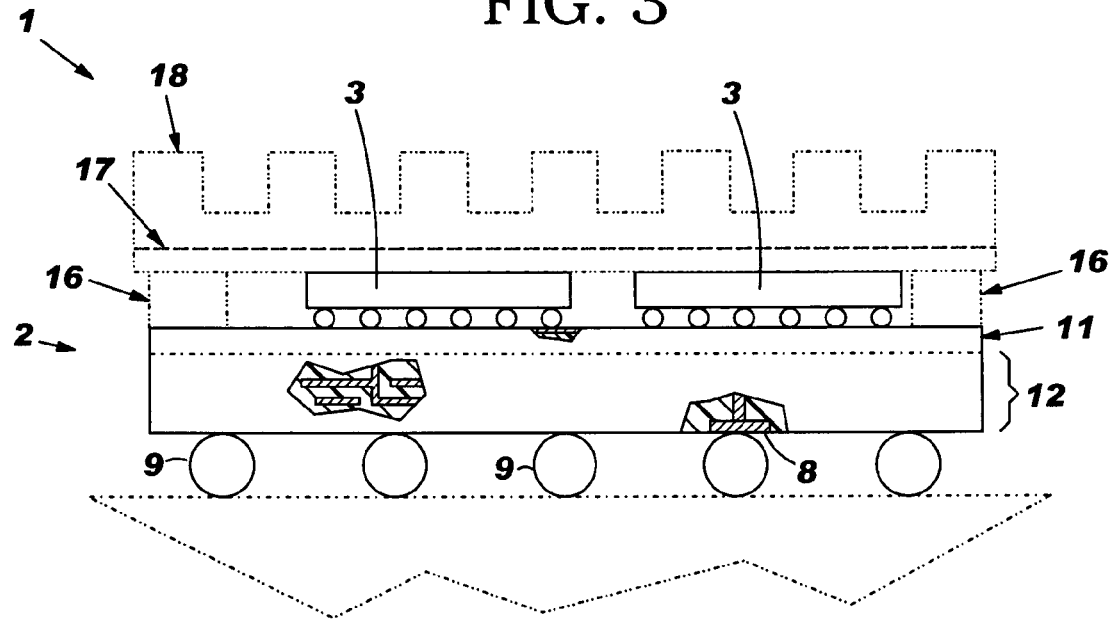
FIG. 3 is an alternative embodiment of an IHS package, illustrating the use of a stiffener member and cover and heat sinking member as part thereof.

FIG. 3 illustrates package 11 as including a stiffener member 16 (in phantom) which rests atop the upper surface of carrier 2 and substantially surrounds the spacedly positioned chips and is also spaced therefrom. The stiffener member further includes a heat-sinking cover member 17 (in phantom) located on an upper surface thereof and a heat-sinking member 18, in phantom, located thereon. Stiffener 16 is preferably of stainless steel material while heat-sinking cover member 17 is preferably copper or aluminum and the heat-sinking member 18 preferably aluminum and including a plurality of upward projections as shown in FIG. 3. The heat-sinking cover member 17 is designed for receiving heat from chips 3 to in turn pass the heat through to the larger heat-sinking member 18 to thus facilitate thermal removal from package 11 during operation thereof. These above heat-sinking components serve to effectively remove the relatively high heat as produced by powerful chips such as those of the ASIC variety, as described above. The additional use of the internal thermally conductive member further assures an effective operating product which will not disrupt or result in damage to the relatively delicate solder connections formed both between the chip and carrier and, if utilized, between the carrier and underlying substrate.

Figure 4:
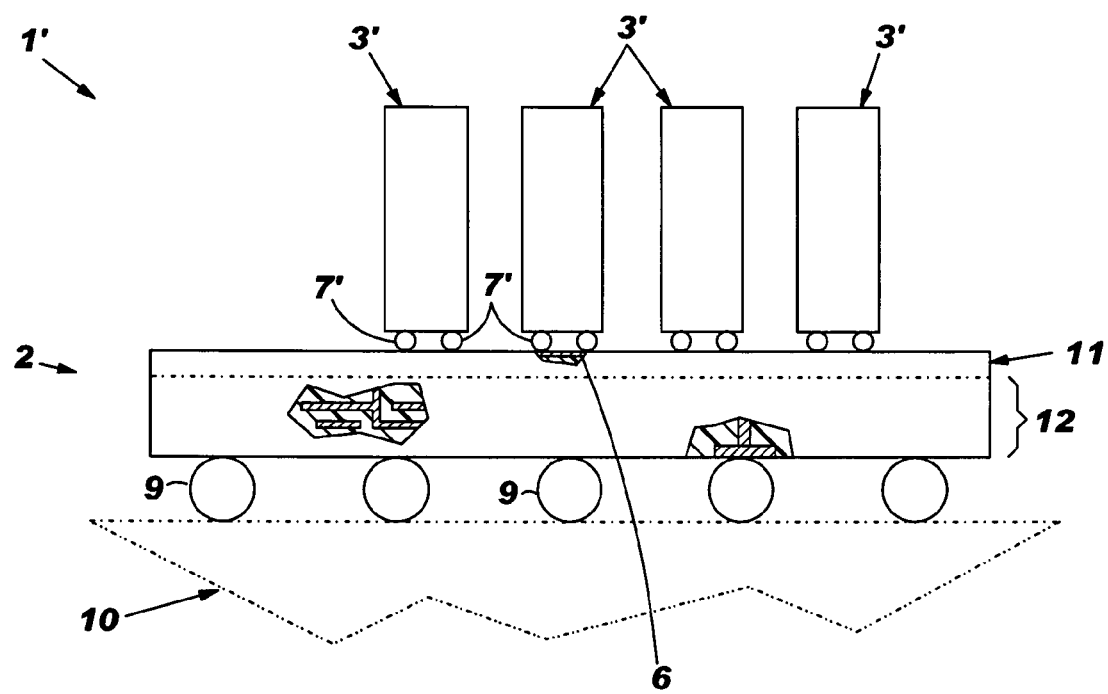
FIG. 4 is a side-elevational view illustrating yet another embodiment of an IHS package.

FIG. 4 illustrates an alternative embodiment of an electronic package 1' usable in an IHS of the invention. Package 1' includes a carrier 2 similar to that described above and preferably utilizes solder elements 9 or the like to couple the carrier to the underlying substrate 10. Package 1' differs from package 1 in FIGS. 1–4, however, by the utilization of substantially vertically oriented chips 3' which are preferably electrically coupled to respective contacts 6 on the carrier's upper surface by respective solder balls 7'. Chips 3' are also preferably oriented substantially parallel to one another and, as understood, possess a width (or length) dimension extending into the page from the viewer's viewpoint. These chips may include surface contact sites similar to those in FIG. 1 with appropriate circuitry extending to the outer (lower) edge thereof such that connections using solder balls 7' can occur. Chip carrier 2, like that in FIGS. 1–3, may also include an internal thermally conductive member (not shown) and/or capacitor (not shown) as described hereinabove. The embodiment of FIG. 4 may also include encapsulant material and a heat-sinking cover member such as shown in FIG. 2, or, alternatively, a stiffener, heat-sinking cover and heat-sink member as shown in FIG. 3. Further description is thus not believed necessary.

FIG. 5 illustrates an information handling system (IHS) 19 according to one embodiment of the invention. By way of example, system 19 may be a server (as shown), a personal computer, mainframe or similar information handling system known in the art. It is well-known in the information handling systems art that these structures include circuit boards and other packages as part thereof. In the instant invention, system 19 is shown to include a circuitized substrate 10 (in phantom) having a multi-chip electronic package 1 (also in phantom) thereon. The positioning relationship of substrate 10 and package 1 is for illustration purposes only in that this assembly can also be located at other locations within system 19, including substantially perpendicular to the orientation shown. It is also understood that several such assemblies may be utilized in such a system, depending on the operational requirements thereof. If the system is a computer, server, mainframe or the like, it will include a central processing unit (CPU), one or more input/output (I/O) devices, and one or more random access storage devices. It may also include various peripheral devices functionally operable therewith, including keyboards, mice, displays, printers, speakers and modems. The components, including positioning thereof within or in operational relationship to a computer, server, mainframe, etc., are well known in the art and further description riot deemed necessary.

Figure 6:
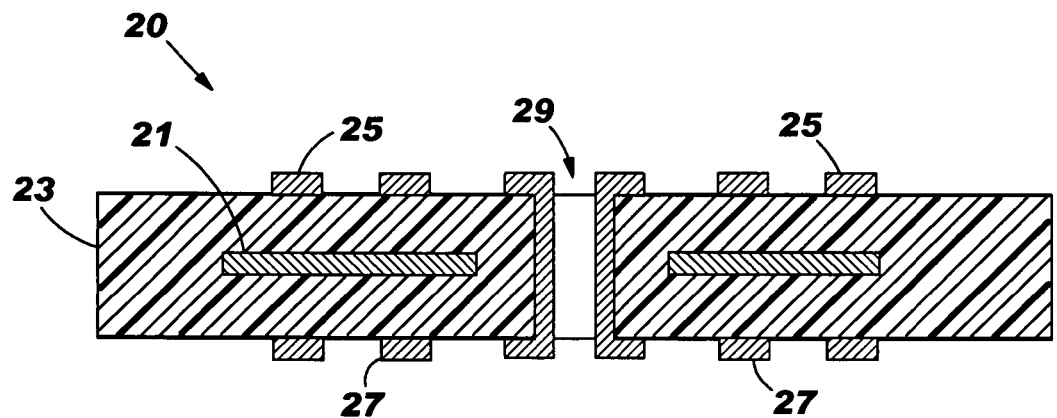
FIG. 6 is a side-elevational view, in section, of one portion of an organic, laminate chip carrier which, when combined with at least one other portion, may be used as the chip carrier in an IHS of the instant invention.
Figure 7:
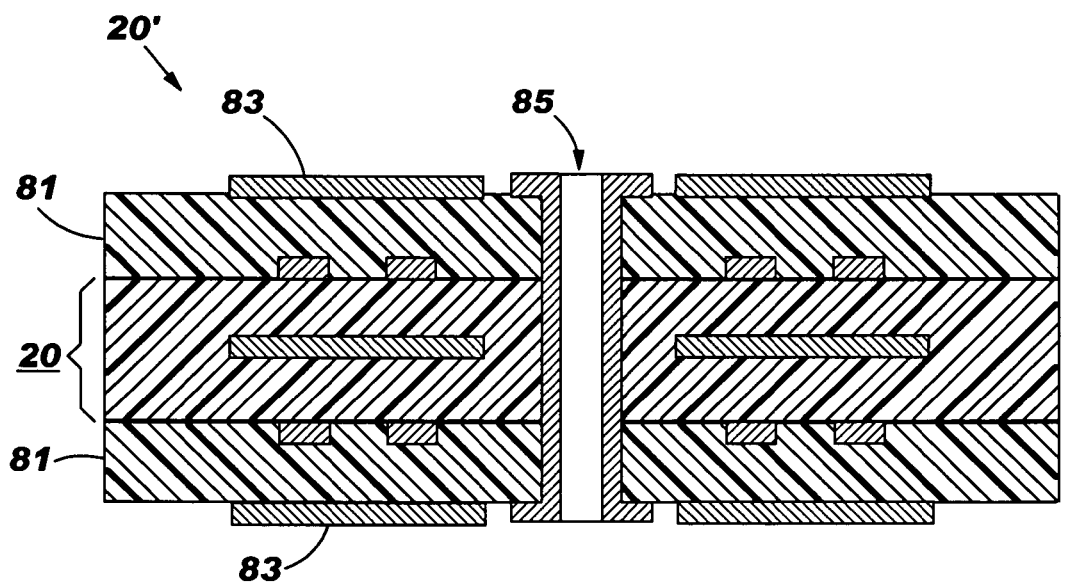
FIG. 7 is a side-elevational view, in section, of another example of a portion of such a laminate chip carrier.

FIGS. 6 and 7 illustrate two embodiments of multilayered portions 20 and 20', respectively, which, when bonded to another multilayered portion, may form the chip carrier usable in the IHS of FIG. 5 and other IHS embodiments. Accordingly, portions 20 and 20' will be defined herein as second portions while the other portion will be referred to as the first (or base) portion. It is to be understood that at least one second portion is to be bonded to at least one first portion such that this second portion lies substantially along the external portions of the final carrier product. It is also understood that one or more of such second portions may be bonded to the base, first portion, including on opposite sides thereof such as depicted in FIGS. 8–11. Most significantly, the second portions are specifically designed for providing high frequency (high speed) connections between semiconductor chips 3 mounted (e.g., soldered) to the second portions and/or otherwise electrically coupled thereto. Importantly, the first or base portion will not necessarily require such capability but instead can be formed in the regular manner for most current PCBs, many of which are described in the above-listed documents. This allows the utilization of known PCB manufacturing techniques to produce a resulting chip carrier with significantly increased capability such that chips secured thereto can be connected at higher speeds than heretofore attainable. Such connections are considered essential in the rapidly expanding IHS art, due primarily to the corresponding increased requirements of such structures. The present invention as defined herein thus provides a significant advancement in the IHS art.

FIG. 6 illustrates a multilayered portion 20 including a central conducting plane 21 which, in a preferred embodiment, serves as a power plane. Plane 21 is surrounded by two layers of dielectric material 23, shown in the drawing as one continuous structure due to the bonding (lamination) of both layers onto plane 21. On the external surfaces of dielectric material 23 are located additional conductive planes 25 and 27, which in a preferred embodiment of the invention comprise a series of signal lines. Portion 20 can thus be simply referred to as a 2SIP structure, meaning it comprises two signal planes and one power plane. A conductive through hole 29 is also provided to connect the upper signal plane 25 with lower plane 27. In a preferred embodiment, the conductive through hole is a plated through hole (PTH), produced using known technologies. Importantly, this PTH or any PTH for that matter is not needed to directly couple the chip contacts to conductors on the laminate's undersurface. The formation of portion 20 is accomplished using known PCB procedures, including lamination of the aforementioned dielectric layers and deposition (e.g., plating) of the external signal planes. Further process description is thus not believed necessary.

Portion 20, as defined above, is designed for providing high speed (high frequency) connections between chips 3 coupled thereto when portion 20 is formed in combination with another multilayered portion to form a final carrier. In order to provide such high speed connections, therefore, the individual signal lines in portion 20 (and 20') preferably possess a width of from about 0.005 inch to about 0.010 inch and a thickness of 0.0010 to about 0.0020 inch. The corresponding dielectric layers each possess a thickness of from about 0.008 inch to about 0.010 inch. The material for planes 21, 25 and 27 is preferably copper, but other conductive materials are possible. The preferred dielectric material 23 is a low loss dielectric, one example being Polyclad LD621, available from Cookson Electronics, located in West Franklin, N.H. Additional materials include Nelco 6000SI, available from Park Nelco, located in Newburgh, N.Y. and Rogers 4300, available from Rogers Corporation, located in Rogers, Conn. These materials have a low dielectric constant and loss factor to provide the optimum operational capabilities for the structure. Other materials possessing dielectric loss $\leq 0.01$, and preferably less than <0.005 would be suitable for use in both portions 20 and 20'. Again, this dielectric material need not be PTFE.

Notably, other thicknesses and materials are possible while attaining the desired results taught herein. It is also understood that the second portion of this structure can include the aforedefined thermally conductive member and/or internal capacitor structure therein. In one example, using the aforementioned thicknesses, widths and materials, it was possible to provide a second portion 20 (and 20') capable of passing signals at a signal frequency within the range of from about 3 to about 10 GPS. This is also not meant to limit the invention because higher frequencies, e.g., 12 GPS, are possible with relatively insignificant modification to one or more of the above materials, parameters, etc. The resulting overall thickness for portion 20 as defined, according to one embodiment, is about 0.140 inch.

The aforementioned widths and thicknesses for the conductive planes and dielectric layers will normally be thicker than those for the base or first multilayered portion to which one or both portions 20 and 20' will be bonded. That is, the base portions will typically include much less thickness and width dimensions for the conductive planes and dielectrics used therein, such widths, thicknesses and materials being typical of those of known PCB structures used today. Thus, further description is not necessary.

Figure 8:
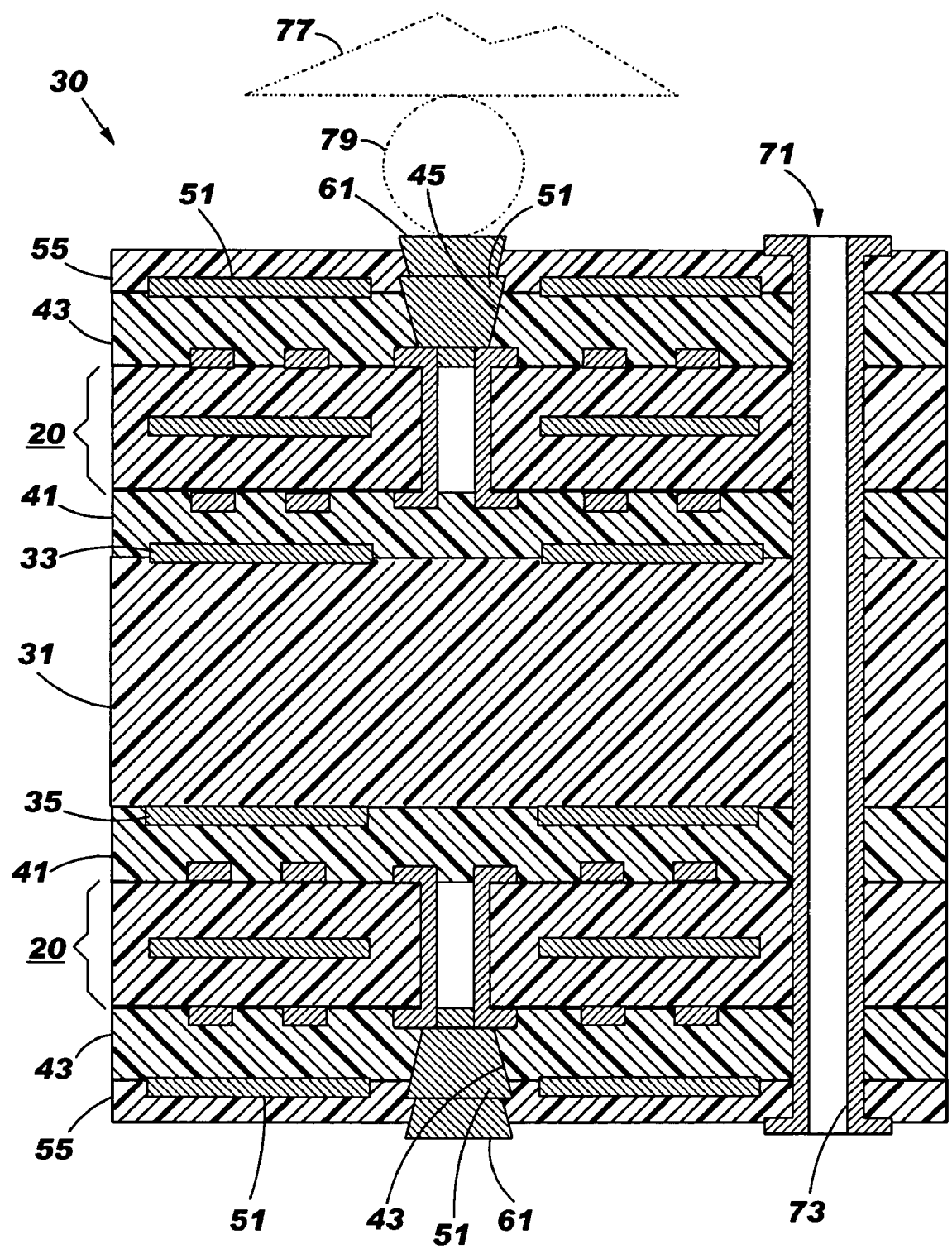
FIG. 8 is an assembled, elevational view, in section, illustrating an IHS organic, laminate chip carrier.

In FIG. 8, there is shown an embodiment of a chip carrier 30 in which two second portions 20 are utilized, each of these portions located on opposite sides of a common first multilayered portion 31. First portion 31 is illustrated, for simplification purposes, as a singular dielectric layer including outer conductive layers 33 and 35 thereon. In one embodiment, layers 33 and 35 are power or ground planes, depending on the operational requirements of the final board 30. In a preferred embodiment, portion 31 will include several (e.g., twenty) conductive planes therein of mixed signal and ground and/or power capabilities and a corresponding plurality (e.g., nineteen) of dielectric layers. In its simplest form, portion 31 (and 31' in FIGS. 9–11) will include at least one signal plane passing signals therealong at a first frequency. As indicated earlier, both conductive planes and dielectric layers used in the first multilayered portion 31 are typically those utilized in a conventional PCB. Therefore, in one example, portion 31 may include conductive signal lines having widths of about 0.003 inch to about 0.010 inch and corresponding thicknesses of 0.0005 inch. The dielectric layers each include an initial thickness of about 0.010 inch. First portion 31, being of such multi-layered construction, is laminated to bond the several conductive dielectric layers to form the first portion 31. Additionally, second portions 20 are similarly formed as separate, multilayered subassemblies as described above. In the next step, a dielectric layer 41 (e.g., conventional pre-preg or thermoplastic material) is added to opposite sides of the interim first portion 31 and another dielectric layer 43 is added to each of the outermost surfaces of portions 20. This structure is now laminated to form a singular, multilayered organic chip carrier, using standard lamination processing. Because of the structural characteristics explained above and herein, at least some of the signal planes in second portions 20 and 20' will provide higher frequency signal passage than at least some of the signal lines in the conventional first portions 31 and 31'. In a preferred embodiment, all signal lines in the external portions will possess such superior capabilities compared to the signal layers of the first portions these are bonded to.

Openings 45 are provided to access one or more of the outer conductive planes on each portion 20 within the outer dielectric layers 43. This is preferably done by laser or photoprinting operations known in the art. Following removal of the dielectric material, an outer conductive layer 51 is added on opposite sides of the structure in FIG. 8, including within the openings in the dielectric. At this point, connections for components are provided on carrier 30 that couple to the signal lines of portions 20 which in turn will assure high speed signal passage along these signal lines, including those on the upper and lower surfaces of each portion 20, to the second chip (not shown in FIG. 8) also coupled to the circuitry of the same portion 20, e.g., at a site to the left of the viewer in FIG. 8. Such connection would also be provided through an opening in conductive material 51 as shown in FIG. 8.

The embodiment of FIG. 8 thus illustrates that two or more semiconductor chips can be mounted on each of the opposite sides of carrier 30 and coupled together with high frequency signals, should the carrier include a modified lower surface or other means to couple it to PCB 10 (i.e., FIG. 1). The carrier of the present invention is thus able to uniquely couple high speed chips on opposite surfaces thereof to assure a finished chip carrier assembly possessing far greater operational capabilities than heretofore known in the art. (In a preferred embodiment, however, carrier 30 will only include one upper high speed portion with two or more chips and one lower speed portion bonded thereto, the latter including the bottom conductors 8 as shown in FIG. 1.)

Another layer of dielectric material 55 may also be added to cover the conductive planes 51, in which case, connection to the conductive material 51 within opening 45 would be accomplished by a similar opening and conductive material 61 in FIG. 8 to electrically couple chips on one side of carrier 30. A plated through hole (PTH) 71 may be utilized to extend through the entire thickness of carrier 30, as illustrated to the right in FIG. 8. Such a through hole could be formed using conventional techniques and would include, e.g., a thin plated layer of conductive material (e.g., copper) on the surfaces thereof. This through hole may also be used to accept a conductive pin or the like if such an added component is desired. PTH 71 can also couple one or more components to internal conductive planes in the carrier's base or first portion 31. The single semiconductor chip shown coupled to the conductive material 61 (or, alternatively, directly to material 51 should material 61 not be utilized) is represented by the numeral 77 and the connecting solder ball by the numeral 79 (not 7 as in FIG. 1). Alternatively, such connection could be provided by a projecting metallic lead (e.g., wirebond) which in turn would be connected, e.g., thermally bonded, to material 61.

Returning to FIG. 7, the portion 20' includes similar components to those of portion 20 in FIG. 6 but represents an alternative embodiment for forming a multilayered carrier using the teachings herein. Portion 20' includes as part thereof the 2SIP portion 20 therein. Dielectric layers 81 are added on opposite surfaces of portion 20, following which conductive layers 83 are then applied, e.g., via plating. The conductive layers 83 are preferably ground or power planes and are coupled together by a plated through hole 85 as shown. Like portion 20, several such through holes are utilized in the second portions to provide such connections. Only one is shown in both FIGS. 6 and 7 for illustration purposes. Dielectric layers 81 are preferably of similar material as the low loss dielectric layers used in portion 20. The layers of portion 20', like portion 20, are assembled using conventional lamination processing.

Figure 9:
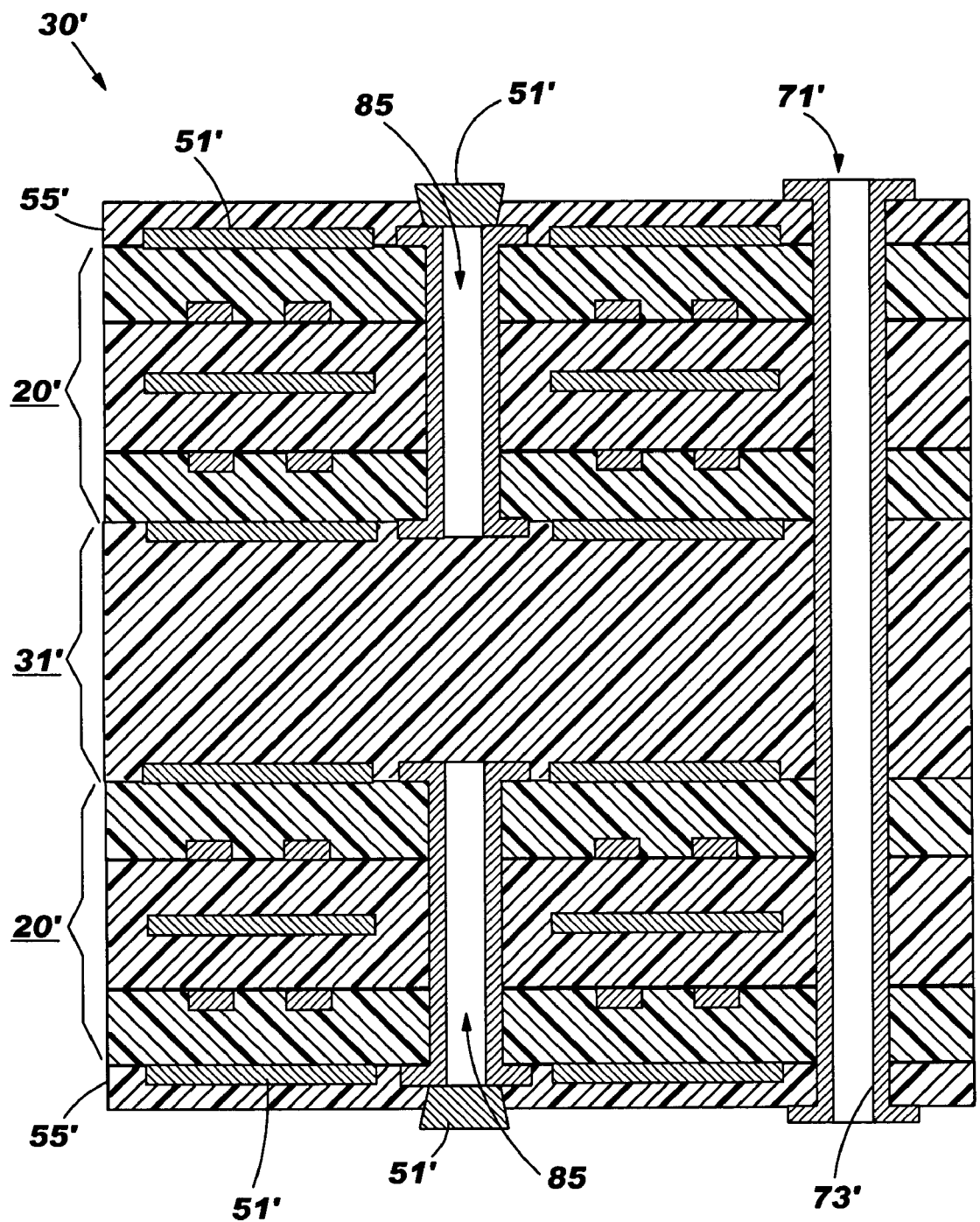
FIG. 9 is another embodiment of an organic, laminate chip carrier which may be used in the instant invention.

Two second portions 20' are shown in FIG. 9 as bonded to a common, interim multilayered first portion 31' which, in one embodiment and as stated above, includes several internal conductive planes (not shown) bonded by a corresponding number of individual dielectric layers (also not shown). The embodiment of FIG. 7 thus represents a simpler means of producing a final carrier (30' in FIG. 9) because of the fewer lamination steps necessary during the final bonding operations. That is, it is only necessary to laminate the three previously formed multilayered structures 20' and 31' shown in FIG. 9. Again, it is noteworthy, and, most preferably, that only one outer portion 20' will be bonded to an underlying conventional portion 31' in accordance with the teachings herein. Following complete lamination, an outer dielectric layer 55' may be added to the structure and a conductive opening 51' provided therein using similar techniques to those defined for providing the opening 45 and conductive material 51 in FIG. 8. A plated through hole 85 will couple any chip joined to material 51' to the top and/or bottom layers of portion 20', if desired. To couple the outermost surfaces of carrier 30', a common through hole 71' is provided, similarly to through hole 71 in FIG. 8. Such a through hole would preferably include the plated conductive material 73' similar to that in FIG. 8.

The through holes 71 and 71' can be used to electrically couple one or more of the chips to the internal wiring of the first multilayered portions 31 and 31', respectively, thus providing a direct electrical connection between these components and the interim structure. Thus, the carrier defined herein may provide the unique capability of assuring coupling between chips on one side of the carrier in addition to coupling of these same chips to internal conductive planes of the base or first portion of the carrier's overall structure.

Figure 10:
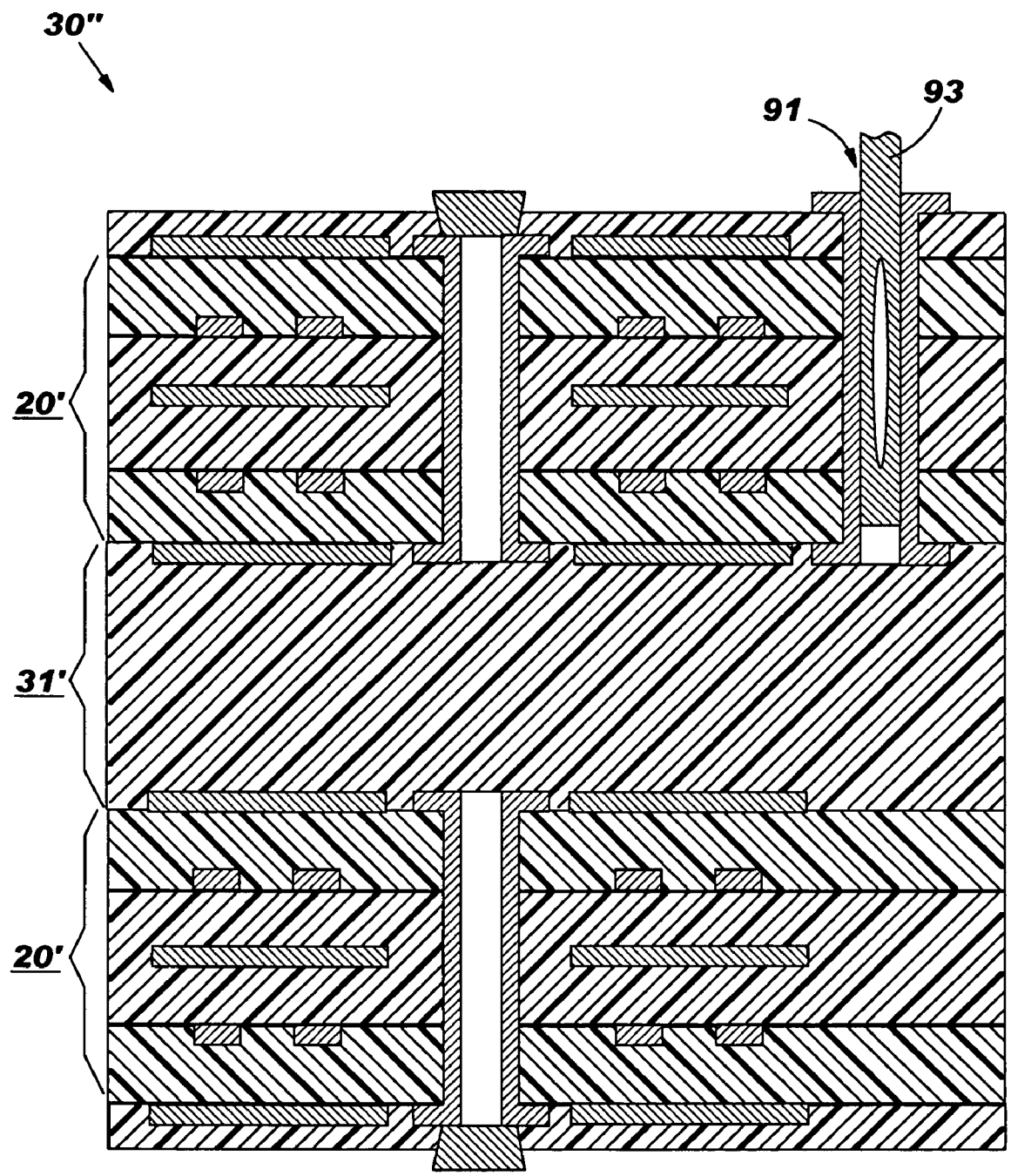
FIG. 10 represents another aspect of a multilayered laminate chip carrier capable of being used in the instant invention.
Figure 11:
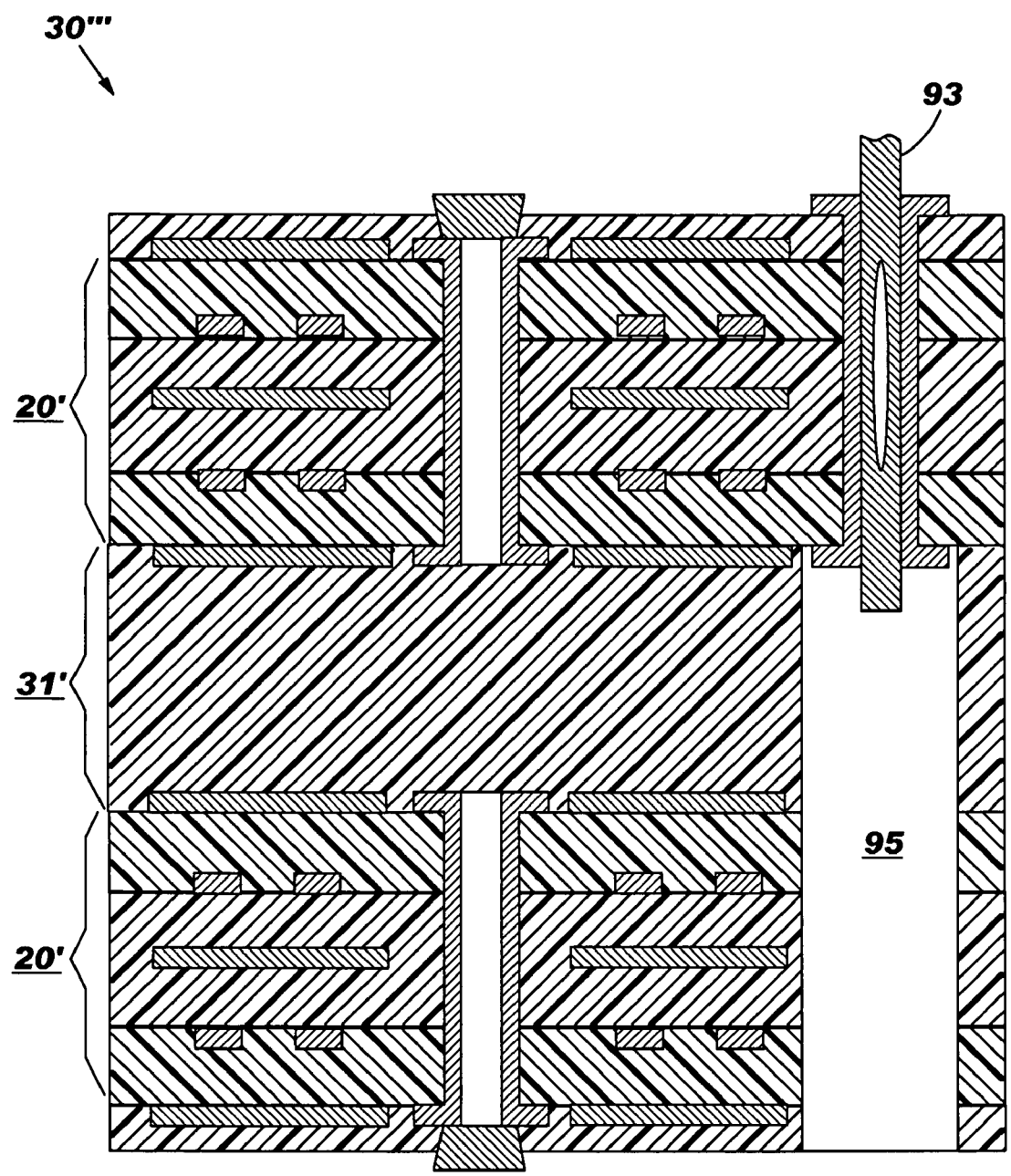
FIG. 11 represents a side-elevational view, in section, of yet another embodiment of an organic chip carrier usable in the present invention.

In FIGS. 10 and 11, there are shown two alternative carrier embodiments 30" and 30''', respectively, that can be used in the IHS product taught herein. The structure of carrier 30" in FIG. 10 is similar to that shown in FIG. 9 with the addition of a conductive through hole 91 extending from an outer surface of the carrier to one of the conductive planes of portion 20'. Coupling of a pinned component (i.e., the pin 93 shown in FIGS. 10 and 11) is thus also possible, in addition to the aforedefined coupling of additional electronic components. In the embodiment of FIG. 11, an elongated opening 95 is provided through the portion 31' (and the lower portion 20', if used). The reason for providing opening 95 is to provide proper clearance for inserting pin 93. Opening 95 can be preformed (drilled) on 31' and 20' (if used) before final lamination, contrasting to the conventional method of "back drilling" in order to eliminate the unused portion of the PTH. Back drilling removes a portion of the PTH layer of copper and reduces the capacitive effects of the PTH when dealing with high speed signals. Back drilling is expensive and difficult to perform. The construction provided negates the need for back drilling and achieves the same results.

Figure 12:
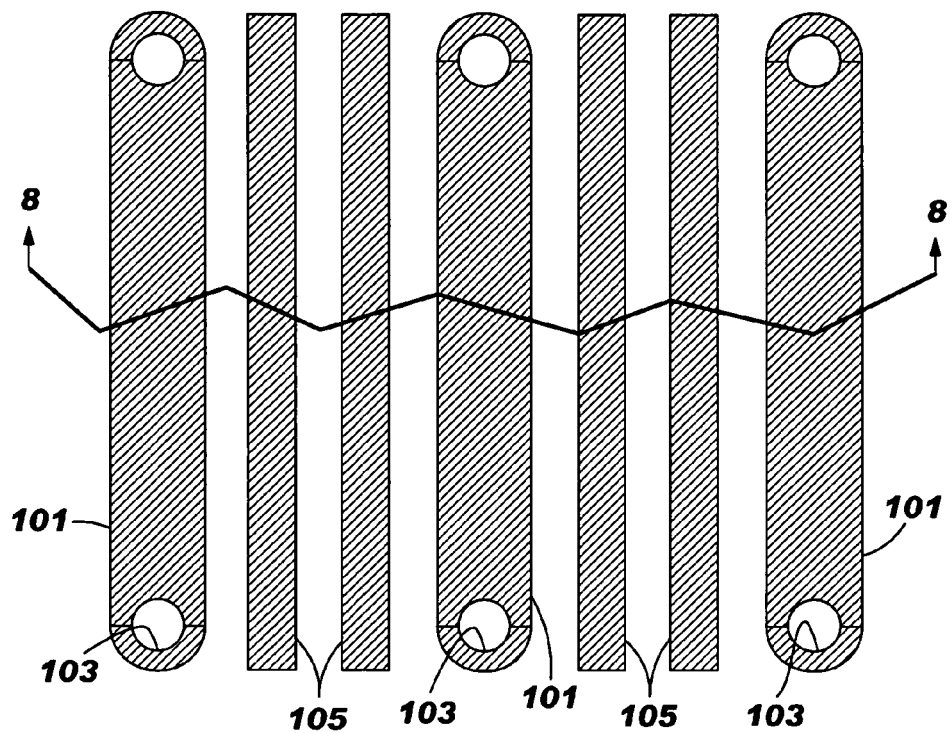
FIG. 12 is a top plan view of a circuit pattern that may be used on an organic, laminate chip carrier usable in the present invention.
Figure 13:
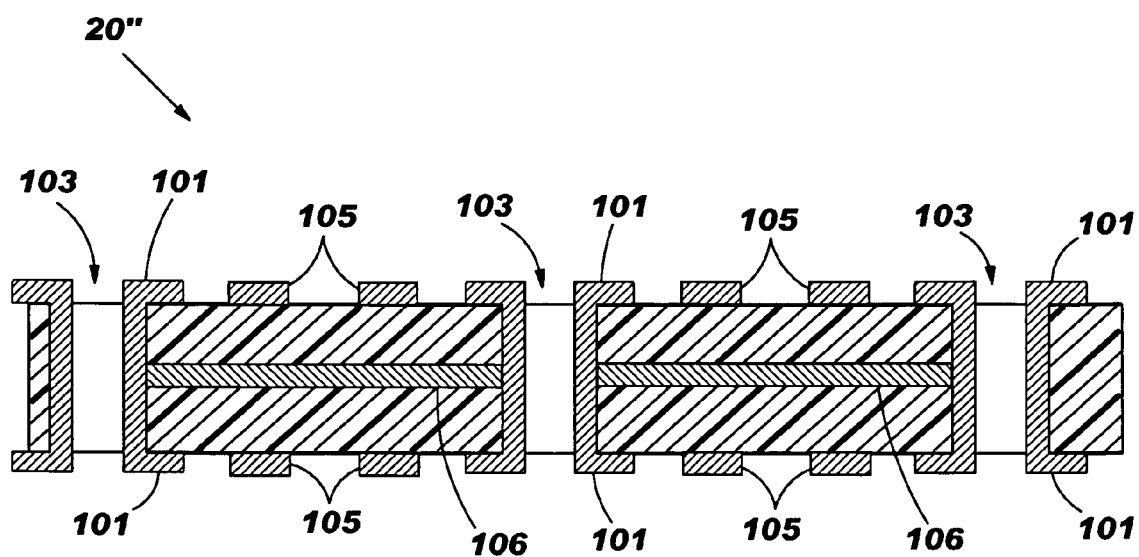
FIG. 13 is a side-elevational view, as taken along the line 8—8 in FIG. 12. It is understood that the embodiment of FIG. 13 represents only a portion of the organic, laminate chip carrier capable of being used in the present invention.

FIGS. 12 and 13 represent another embodiment of a second portion 20" which can be used in the invention. Understandably, FIG. 13 is a sectional view taken along the line 8—8 in FIG. 12 and serves to illustrate one embodiment of the respective widths of conductors on the upper surface of portion 20". The through holes located at respective ends of the broader width conductors are also shown. In this arrangement, the broader width conductors 101 serve as signal lines to interconnect plated through holes 103 at the opposite ends thereof. In comparison, the narrower width signal lines 105 extend in paired relationship between the respective outer pairs of the wider lines 101. In one embodiment, lines 101 may possess a width of from about 0.003 inch to about 0.012 inch while the corresponding internal, narrower lines each may possess a width of 0.02 inch to about 0.10. These lines were spaced apart a distance of from about 0.03 inch to about 0.12 inch. The purpose of providing the greater width lines 101 on opposite sides of the paired narrower signal lines 105 is to provide proper trace impedance control as well as signal shielding to minimize noise coupling amongst signal lines. As seen in FIG. 13, these lines are positioned on opposite sides of portion 20", with the narrower lines 105 located externally of an interim conductive (e.g., power) plane 106 coupled to the center PTH 103. This arrangement provides the advantageous feature of a continuous reference plane that can provide maximum signal shielding. This provides for simpler construction of subcomposites and also allows for sections with Z connections that can have different dielectric thicknesses; for example, fast signals vs. slower signals. Although such a pattern is shown, however, it is understood that in a preferred embodiment of the invention, each of the solder balls 7 (FIG. 1) will be coupled to a singular contact 6 arranged in a pattern similar to the pattern of balls 7. The above pattern may be used to interconnect respective outer rows of such balls on one chip to corresponding outer rows of balls on another, adjacent chip, or to form other means of connection.

Thus there has been shown and described an IHS structure (assembly) which utilizes a multi-chip electronic package which comprises an organic, laminate chip carrier and a plurality of semiconductor chips spacedly positioned on a first surface thereof. There has also been shown and described an electronic package assembly for use in this IHS structure, the package assembly including the aforementioned carrier and semiconductor chips in combination with a circuitized substrate (e.g., PCB) in which a plurality of electrically conductive elements (e.g., solder balls) are used to connect the chip carrier to the substrate. Significantly, the organic, laminate chip carrier used in the IHS product is capable of having two or more high-temperature semiconductor chips electrically coupled thereto which may be coupled together and/or coupled to electrical conductors on the undersurface (opposite side) of the carrier. Of further significance, these chips may be coupled in a high-speed manner so as to assure higher frequency signal passage therebetween, thus resulting in a final product structure possessing greater capabilities than heretofore known in the art. The invention is able to attain these capabilities using an IHS carrier comprised substantially of organic laminate material such as described herein which, as defined herein, will not deform or otherwise be harmed as a result of the high temperature operation of the semiconductor chips during package operation and positioning on the desired underlying circuitized substrate. The IHS chip carrier may in turn thus be comprised of at least two portions formed in accordance with the teachings herein. Additionally, the IHS carrier may include an internal capacitor structure such as defined and/or a thermally conductive member as part thereof designed to specifically prevent separation (disconnection) between the respective solder balls which form the connections between the chips and carrier and those, if utilized, between the undersurface of the carrier and the corresponding substrate. The invention as defined herein thus possesses many significant advantages over known IHS structures.

While there have been shown and described what are at present the preferred embodiments of the invention, it will be obvious to those skilled in the art that various changes and modifications may be made therein without departing from the scope of the invention as defined by the appended claims.

What is claimed is:

1. An information handling system including a multi-chip electronic package therein, said multi-chip electronic package comprising an organic, laminate chip carrier including a plurality of electrically conductive planes spacedly positioned therein and separated by respective layers of dielectric material, said chip carrier including a plurality of electrical contacts on a first surface thereof and a plurality of electrical conductors on a second surface thereof, selected ones of said electrical contacts being electrically coupled to selected ones of said electrical conductors, and a plurality of semiconductor chips spacedly positioned on said first surface of said organic, laminate chip carrier and electrically coupled to selected ones of said electrical contacts so as to be coupled to said selected ones of said electrical conductors, said plurality of semiconductor chips each being oriented substantially perpendicular to said first surface of said organic, laminate chip carrier.

2. The system of claim 1 wherein selected ones of said electrical contacts are electrically coupled to other selected ones of said electrical contacts such that selected ones of said semiconductor chips are electrically coupled to one another.

3. The system of claim 1 wherein said plurality of semiconductor chips are substantially parallel to one another.

4. The system of claim 1 further including a quantity of encapsulant material located on said first surface of said organic, laminate chip carrier and substantially surrounding said plurality of semiconductor chips.

5. The system of claim 1 further including a heat-sinking cover member positioned substantially over said plurality of semiconductor chips and in thermal contact therewith.

6. The system of claim 1 further including a stiffener member positioned on said first surface of said organic, laminate chip carrier and spacedly positioned about said plurality of semiconductor chips.

7. The system of claim 6 further including a heat-sinking cover member positioned substantially over said plurality of semiconductor chips and in thermal contact therewith.

8. The system of claim 7 further including a heat-sinking member for removing heat generated by said semiconductor chips during operation thereof, said heat-sinking member being positioned on said heat sinking cover member.

9. The system of claim 1 wherein said organic, laminate chip carrier includes a thermally conductive member therein and a plurality of solder elements coupling said plurality of semiconductor chips to said electrical contacts on said first surface of said organic, laminate chip carrier, said thermally conductive member having a selected thickness and coefficient of thermal expansion to substantially prevent failure of said electrical couplings formed by said solder elements on said electrical contacts.

10. The system of claim 9 wherein said thermally conductive member is comprised of a first layer of copper, a second layer of an iron alloy and a third layer of copper.

11. The system of claim 1 wherein said organic, laminate chip carrier includes a first multilayered portion including at least one dielectric layer and at least one conductive plane wherein said conductive plane includes signal lines capable of having signals pass there-along at a first frequency and a second multilayered portion bonded to said first multilayered portion and adapted for having said plurality of semiconductor chips coupled thereto, said second multilayered portion including at least one dielectric layer and at least one conductive signal plane wherein said conductive signal plane of said second multilayered portion includes signal lines capable of having signals pass there-along at a higher frequency than said first frequency to thereby provide a high speed connection between said plurality of semiconductor chips.

12. The system of claim 11 wherein said second multilayered portion includes a conducting plane, first and second dielectric layers on opposite sides of said conducting plane, and the number of conductive signal planes is two, each conductive signal plane including said signal lines capable of having signals pass therealong and being positioned on a respective one of said first and second dielectric layers opposite said conducting plane.

13. The system of claim 12 wherein said second multilayered portion further includes a conductive through hole interconnecting at least one of said signal lines of said conductive signal plane on said first dielectric layer with at least one of said signal lines of said conductive signal plane on said second dielectric layer.

14. The system of claim 1 wherein said organic, laminate chip carrier includes an internal capacitor therein.

15. The system of claim 1 further including a circuitized substrate including a plurality of electrically conductive members thereon, said multi-chip electronic package being positioned on and electrically coupled to said circuitized substrate.

16. The system of claim 15 wherein said circuitized substrate comprises a printed circuit board.

17. The system of claim 15 further including a plurality of electrically conductive elements electrically connecting said selected ones of said electrical conductors on said second surface of said organic, laminate chip carrier to respective ones of electrically conductive members on said circuitized substrate.

18. The system of claim 17 wherein said plurality of electrically conductive elements comprises a plurality of solder balls.

19. The invention of claim 1 wherein said information handling system is selected from the group consisting of a computer, server and mainframe.

20. The system of claim 19 wherein said computer, server or mainframe includes a central processing unit, one or more input/output devices and one or more random access storage devices.

21. The system of claim 19 further including one or more peripheral devices functionally operable with said computer, server or mainframe.

22. The system of claim 21 wherein said one or more peripheral devices is selected from the group consisting of a keyboard, mouse, display, printer, speaker and modem.

23. An information handling system including a multi-chip electronic package therein, said multi-chip electronic package comprising an organic, laminate chip carrier including a plurality of electrically conductive planes spacedly positioned therein and separated by respective layers of dielectric material, said chip carrier including a plurality of electrical contacts on a first surface thereof and a plurality of electrical conductors on a second surface thereof, selected ones of said electrical contacts being electrically coupled to selected ones of said electrical conductors, a plurality of semiconductor chips spacedly positioned on said first surface of said organic, laminate chip carrier and electrically coupled to selected ones of said electrical contacts so as to be coupled to said selected ones of said electrical conductors, a stiffener member positioned on said first surface of said organic, laminate chip carrier and spacedly positioned about said plurality of semiconductor chips, a heat-sinking cover member positioned over said plurality of semiconductor chips, and a heat-sinking member positioned on said heat sinking cover member for removing heat generated by said semiconductor chips during operation thereof.

24. The system of claim 23 wherein selected ones of said electrical contacts are electrically coupled to other selected ones of said electrical contacts such that selected ones of said semiconductor chips are electrically coupled to one another.

25. The system of claim 23 wherein said plurality of semiconductor chips are oriented in a substantially coplanar orientation on said first surface of said organic, laminate chip carrier.

26. The system of claim 23 further including a quantity of encapsulant material located on said first surface of said organic, laminate chip carrier and substantially surrounding said plurality of semiconductor chips.

27. The system of claim 23 wherein said organic, laminate chip carrier includes a thermally conductive member therein and a plurality of solder elements coupling said plurality of semiconductor chips to said electrical contacts on said first surface of said organic, laminate chip carrier, said thermally conductive member having a selected thickness and coefficient of thermal expansion to substantially prevent failure of said electrical couplings formed by said solder elements on said electrical contacts.

28. The system of claim 27 wherein said thermally conductive member is comprised of a first layer of copper, a second layer of an iron alloy and a third layer of copper.

29. The system of claim 23 wherein said organic, laminate chip carrier includes a first multilayered portion including at least one dielectric layer and at least one conductive plane wherein said conductive plane includes signal lines capable of having signals pass there-along at a first frequency and a second multilayered portion bonded to said first multilayered portion and adapted for having said plurality of semiconductor chips coupled thereto, said second multilayered portion including at least one dielectric layer and at least one conductive signal plane wherein said conductive signal plane of said second multilayered portion includes signal lines capable of having signals pass there-along at a higher frequency than said first frequency to thereby provide a high speed connection between said plurality of semiconductor chips.

30. The system of claim 29 wherein said second multilayered portion includes a conducting plane, first and second dielectric layers on opposite sides of said conducting plane, and the number of conductive signal planes is two, each conductive signal plane including said signal lines capable of having signals pass there-along and being positioned on a respective one of said first and second dielectric layers opposite said conducting plane.

31. The system of claim 30 wherein said second multilayered portion further includes a conductive through hole interconnecting at least one of said signal lines of said conductive signal plane on said first dielectric layer with at least one of said signal lines of said conductive signal plane on said second dielectric layer.

32. The system of claim 23 wherein said organic, laminate chip carrier includes an internal capacitor therein.

33. The system of claim 23 further including a circuitized substrate including a plurality of electrically conductive members thereon, said multi-chip electronic package being positioned on and electrically coupled to said circuitized substrate.

34. The system of claim 33 wherein said circuitized substrate is a printed circuit board.

35. The system of claim 33 further including a plurality of electrically conductive elements electrically connecting said selected ones of said electrical conductors on said second surface of said organic, laminate chip carrier to respective ones of electrically conductive members on said circuitized substrate.

36. The system of claim 35 wherein said plurality of electrically conductive elements comprises a plurality of solder balls.

37. The invention of claim 23 wherein said information handling system is selected from the group consisting of a computer, server and mainframe.

38. The system of claim 37 wherein said computer, server or mainframe includes a central processing unit, one or more input/output devices and one or more random access storage devices.

39. The system of claim 38 further including one or more peripheral devices functionally operable with said computer, server or mainframe.

40. The system of claim 39 wherein said one or more peripheral devices is selected from the group consisting of a keyboard, mouse, display, printer, speaker and modem.

* * * * *